(12) United States Patent
MacDonald et al.

(10) Patent No.: US 6,650,101 B2
(45) Date of Patent: Nov. 18, 2003

(54) TIMEBASE FOR SAMPLING AN INPUT SIGNAL HAVING A SYNCHRONOUS TRIGGER

(75) Inventors: Willard MacDonald, Bolinas, CA (US); Roger Lee Jungerman, Petaluma, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 46 days.

(21) Appl. No.: 10/118,449

(22) Filed: Apr. 8, 2002

(65) Prior Publication Data

US 2003/0189423 A1 Oct. 9, 2003

(51) Int. Cl.$^7$ .......................... G01R 13/14; G11C 27/02
(52) U.S. Cl. ................. 324/76.24; 324/76.38; 324/76.15; 327/91; 327/141
(58) Field of Search ............... 324/76.24, 76.38, 324/76.15; 327/91, 141

(56) References Cited

U.S. PATENT DOCUMENTS

| | | | | |
|---|---|---|---|---|
| 3,843,926 A | * | 10/1974 | Espenlaub et al. | 324/102 |
| 5,454,015 A | * | 9/1995 | Olafsson | 375/345 |
| 6,401,213 B1 | * | 6/2002 | Jeddeloh | 713/401 |
| 6,434,706 B1 | * | 8/2002 | Jensen et al. | 713/500 |
| 6,573,761 B1 | * | 6/2003 | MacDonald et al. | 327/91 |

OTHER PUBLICATIONS

Agilent Technologies, Inc. Attorney Docket No. 10010334–1—USSN 09/887,992 filed Jun. 22, 2001; Random Sampling With Phase Measurement; Inventors: Roger Lee Jungerman, Lovell H. Camnitz and Randall King.

Agilent Technologies, Inc. Attorney Docket No. 10011211–1—USSN 10/003,918 filed Nov. 1, 2001; Zero–Crossing Direction And Time Interval Jitter Measurement Apparatus Using Offset Sampling; Inventors: Lovell H. Camnitz, Roger Lee Jungerman and Randall King.

Agilent Technologies, Inc. Attorney Docket No. 10010400–1—USSN 09/919,155 filed Jul. 31, 2001; Quasi–Periodic Optical Sampling; Inventor: Roger Lee Jungerman.

Agilent Technologies, Inc. Attorney Docket No. 10011354–1—USSN 10/117,954 filed Apr. 8, 2002; Timebase For Sampling An Applied Signal Having A Synchronous Trigger; Inventors: Willard MacDonald and Roger Lee Jungerman.

* cited by examiner

Primary Examiner—N. Le
Assistant Examiner—Donald M Lair
(74) Attorney, Agent, or Firm—John L. Imperato (57) ABSTRACT

A timebase establishes the timing of samples acquired by a signal sampler relative to a trigger signal that is synchronous with an input signal applied to the signal sampler. The synchronous trigger activates a first pair of samplers included in the timebase to acquire samples of a reference signal and of a shifted version of the reference signal provided within the timebase. A divider receives the reference signal and divides the frequency of the reference signal by a predesignated divisor, and a third sampler included in the timebase acquires samples of this divided reference signal, also according to the synchronous trigger. The samples of the input signal are acquired by the signal sampler according to the divided reference signal. A timing analyzer determines the timing of these acquired samples of the input signal relative to the synchronous trigger, based on the acquired samples of the reference signal, the shifted reference signal and the divided reference signal. Alternatively, the timebase is implemented according to a method that determines the timing of the samples of the input signal acquired from the signal sampler.

30 Claims, 6 Drawing Sheets

TIMEBASE FOR SAMPLING AN INPUT SIGNAL HAVING A SYNCHRONOUS TRIGGER

BACKGROUND OF THE INVENTION

Oscilloscopes and other types of equivalent-time sampling systems are used to reconstruct the waveforms of many types of optical and electrical signals. Within an equivalent-time sampling system, samples of an applied input signal are acquired by a sampler. A timebase within the equivalent-time sampling system establishes the timing of the acquired samples, so that a waveform of the input signal can be reconstructed on a display or other output device. Timing accuracy and jitter are performance parameters of the timebase that determine how accurately the waveform reconstructed by the sampling system represents the applied signal.

Figure 1:
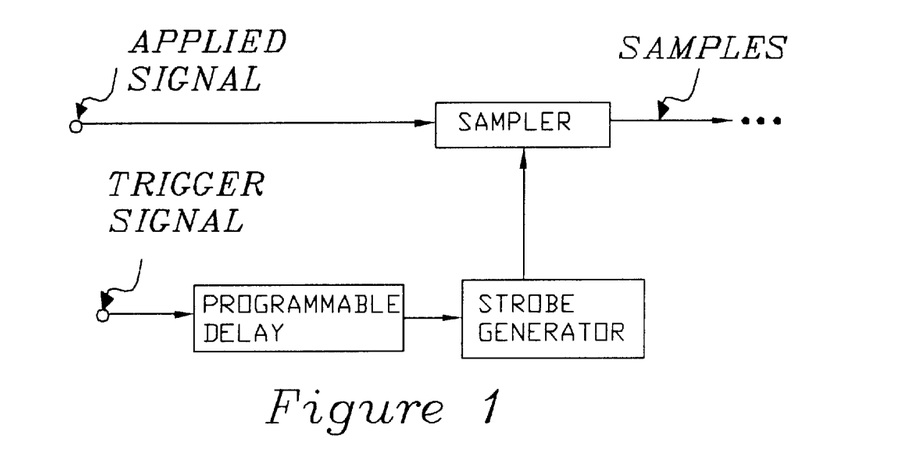
FIG. 1 shows the first type of sampling system.

A first type of sampling system is shown in FIG. 1. The timebase for this sampling system includes a programmable delay that is relied upon to establish the timing of samples acquired by a sampler relative to an applied trigger signal. As a result, performance of the sampling system is limited by the performance attributes of the programmable delay. Due to inherent noise and inaccuracies of presently available devices and elements used to implement the programmable delay, timing accuracy of the sampling system is limited to approximately four picoseconds, and jitter is limited to greater than approximately one picosecond. This low timing accuracy and high jitter prevent this type of sampling system from accurately reconstructing the waveforms of many types of applied signals, such as those present in high data-rate communication systems.

Figure 2:
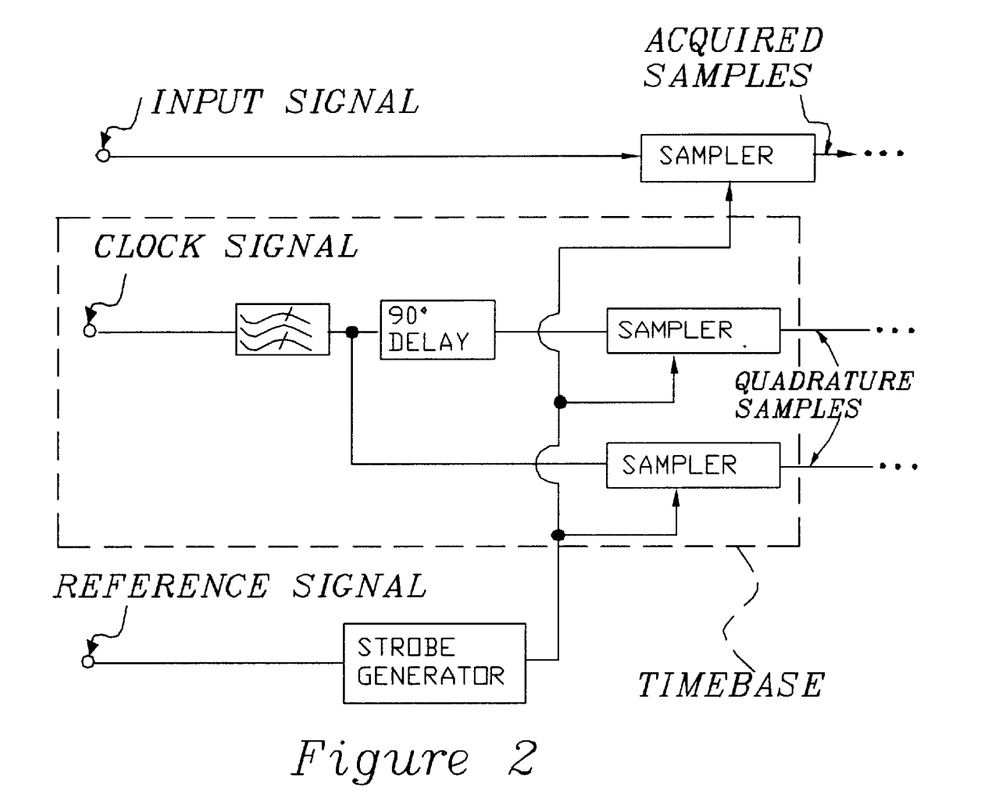
FIG. 2 shows the second type of sampling system.

A second type of sampling system is shown in FIG. 2. The timebase for this sampling system uses quadrature sampling of a clock signal to establish the timing of acquired samples of an applied input signal, and relies on the clock signal being synchronous with, or having an established periodic relationship with, the input signal. The quadrature sampling provides high timing accuracy (approximately 200 femtoseconds) and low jitter (approximately 100 femtoseconds). However, the sampling system is not suitable for reconstructing those portions of the input signal that do not lie within a single cycle, or period, of the clock signal.

SUMMARY OF THE INVENTION

A timebase constructed according to a first embodiment of the present invention establishes the timing of samples acquired by a signal sampler relative to a trigger signal that is synchronous with an input signal applied to the signal sampler. The timebase has high timing accuracy, low jitter, and enables portions of the applied input signal that do not lie within a single cycle, or period, of a provided reference signal to be reconstructed.

The synchronous trigger activates a first pair of samplers included in the timebase to acquire samples of a reference signal and of a shifted version of the reference signal provided within the timebase. A divider receives the reference signal and divides the frequency of the reference signal by a predesignated divisor, and a third sampler included in the timebase acquires samples of this divided reference signal, also according to the synchronous trigger. The samples of the input signal are acquired by the signal sampler according to the divided reference signal. A timing analyzer determines the timing of these acquired samples of the input signal relative to the synchronous trigger, based on

2 the acquired samples of the reference signal, the shifted reference signal and the divided reference signal. Because the timing of the samples of the input signal is derived from the reference signal, the timebase has high timing accuracy and low jitter. In addition, the divided reference signal enables portions of the input signal that lie beyond a single period of the reference signal to be reconstructed.

In an alternative embodiment of the present invention, the timebase is implemented according to a method that determines the timing of the samples of the input signal acquired by the signal sampler.

DETAILED DESCRIPTION OF THE EMBODIMENTS

Figure 3A:
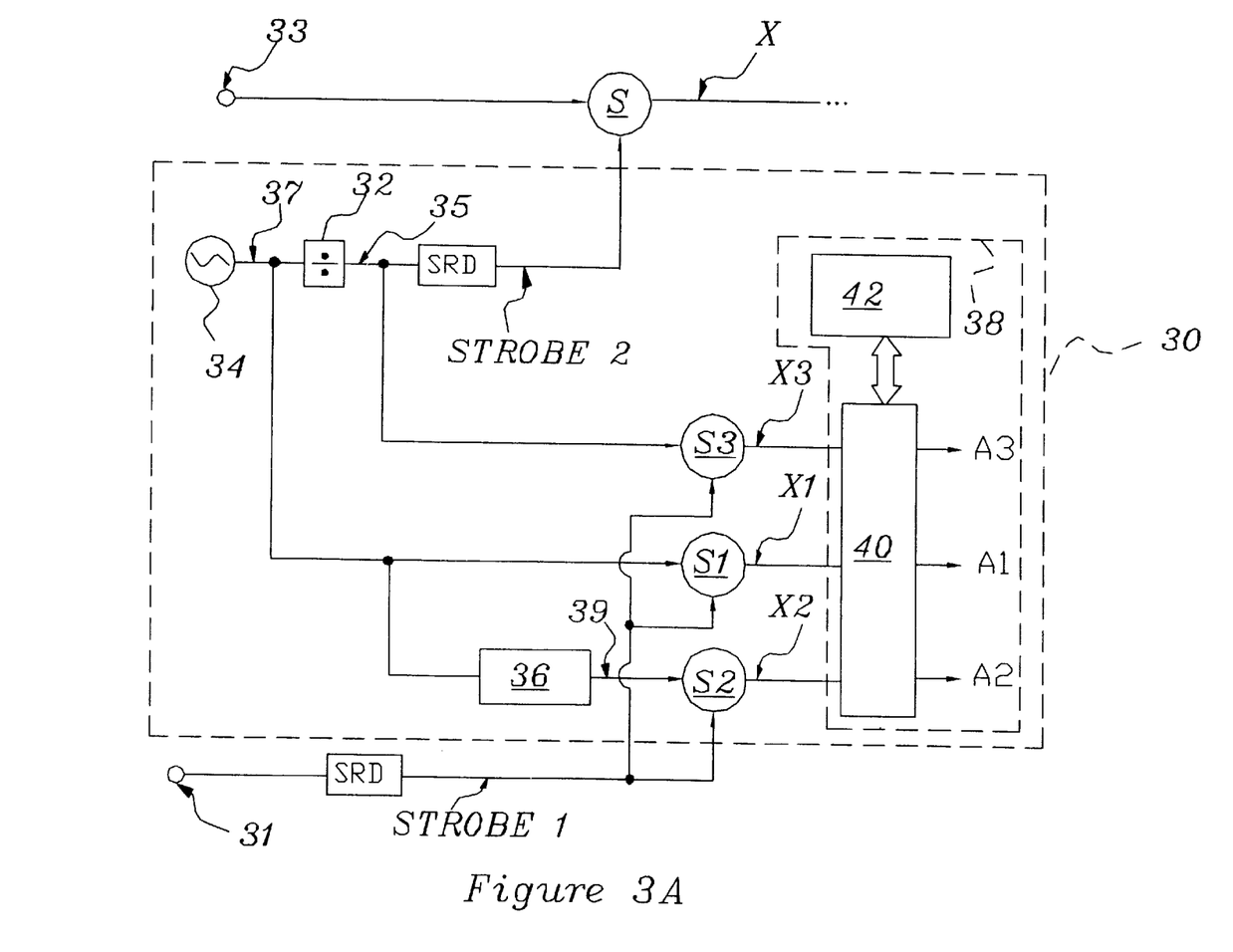
FIGS. 3A–3B show a timebase constructed according to a first embodiment of the present invention.
Figure 3B:
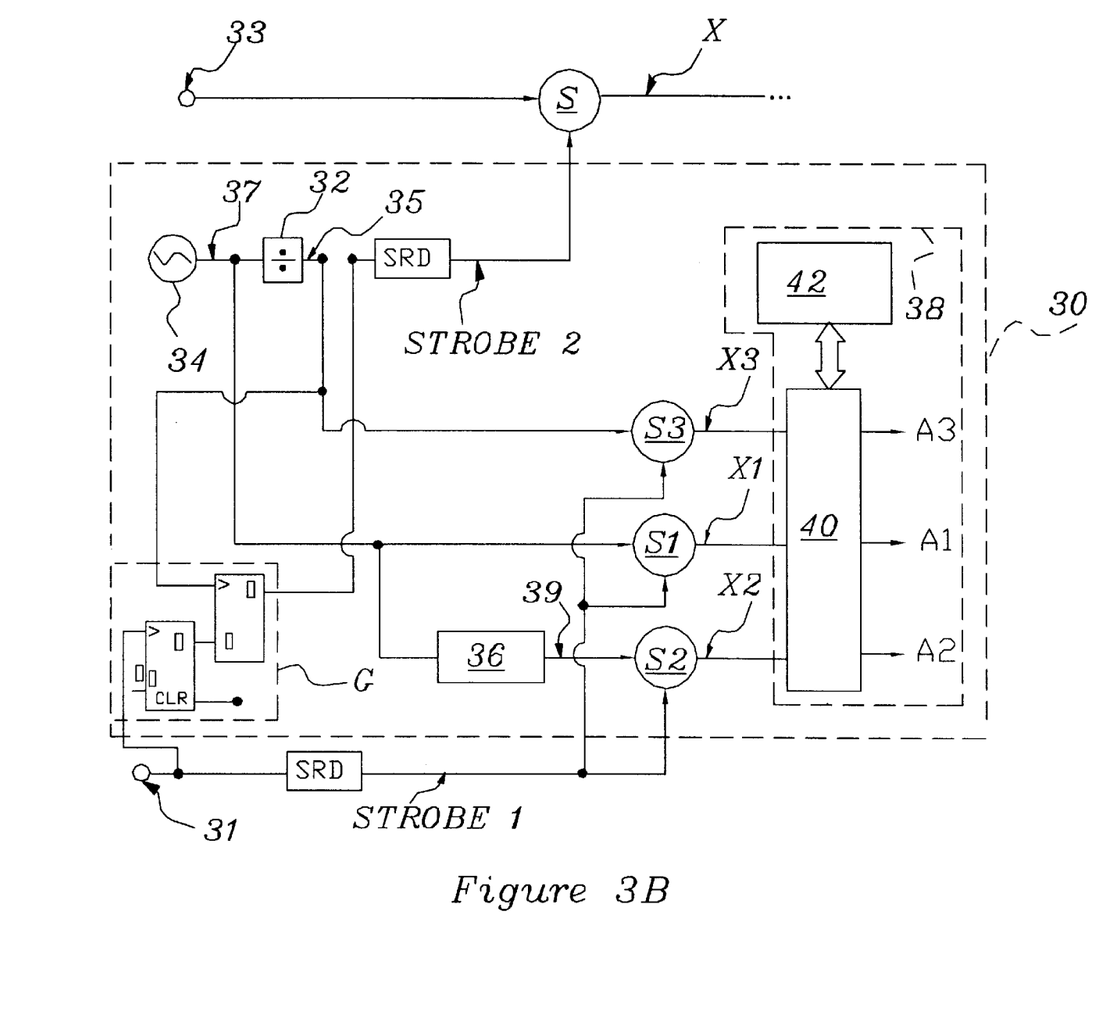

FIGS. 3A–3B show a timebase 30 constructed according to a first embodiment of the present invention. Typically, the timebase 30 is incorporated into an oscilloscope or other type of sampling system that is used to analyze applied optical or electrical signals or reconstruct the applied signals on a display or other output device (not shown), based on samples X of the signals acquired by a signal sampler S. The timebase 30 establishes timing P of the samples X relative to a trigger signal (hereinafter synchronous trigger 31) that is synchronous with an input signal 33 applied to the signal sampler S.

The timebase 30 includes a reference source 34 that provides a reference signal 37 having a period T. The reference source 34 is typically an oscillator, signal generator, or other frequency-stable signal source. In the timebase 30, there is no requirement that the reference signal 37 provided by the reference source 34 be synchronous with, or have an established periodic relationship with, either the input signal 33 or the synchronous trigger 31. With the reference signal 37 being asynchronous with the input signal 33 and the synchronous trigger 31, pseudo-random equivalent-time sampling or other successive sampling of the input signal 33 is enabled by the timebase 30.

The reference source 34 is coupled to a delay element (hereinafter reference delay 36) that shifts, or time-delays the reference signal 37 by a time interval $\tau_T$. The reference signal 37, as shifted by the time interval $\tau_T$ is designated as shifted reference signal 39. However, any technique capable of generating a pair of coherent signals wherein one signal of the pair is shifted relative to the other signal of the pair is suitable for providing the reference signal 37 and the divided reference signal 35.

The reference source 34 is also coupled to a divider 32 that divides the frequency of the reference signal 37 by a divisor D to produce a divided reference signal 35 having a period equal to $D*T$, which is the product of the divisor D and the period T of the reference signal 37. The divider 32 is an edge triggered frequency divider that is cascaded with a filter to produce a divided reference signal 35 that is approximately sinusoidal. Alternatively, the divided reference signal 35 is generated using phase locked loop (PLL) techniques so that the reference signal 37 and divided reference signal 35 are derived from a common oscillator. However, any technique capable of generating a pair of coherent signals wherein one signal of the pair has a frequency that is a multiple of the frequency of the other signal of the pair is suitable for providing the reference signal 37 and a divided reference signal 35.

Figure 4:
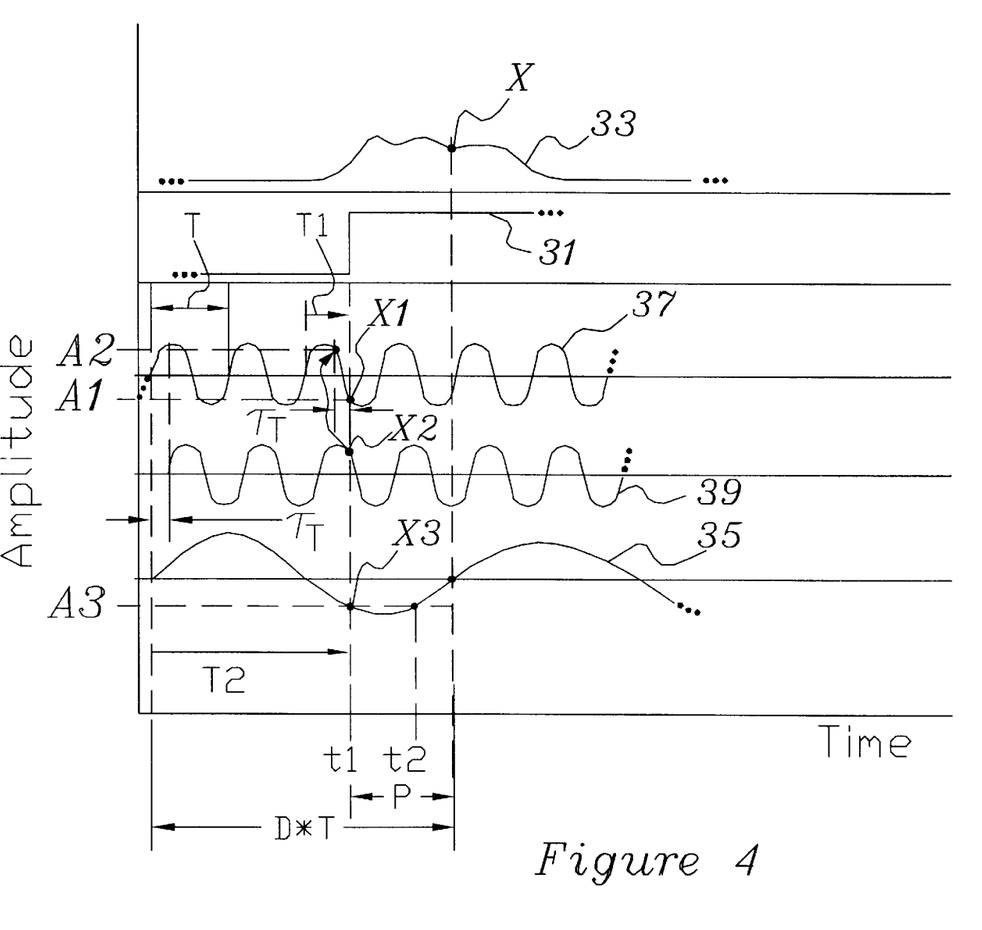
FIG. 4 is a timing diagram for the timebase shown in FIGS. 3A–3B.

The reference signal 37, shown in a timing diagram in FIG. 4, has cyclical amplitude values at corresponding time positions within each period T and has the characteristic that a unique time position within each period T is capable of being resolved based on two amplitude values that are separated from each other in time by the time interval $\tau_T$. The divided reference signal 35 also has cyclical amplitude values at corresponding time positions within each period D*T of the divided reference signal 35. In the example shown in FIG. 4, the divided reference signal 35 is sinusoidal, the reference signal 37 is sinusoidal, and the time interval $\tau_T$ by which the shifted reference signal 39 is shifted relative to the reference signal 35 is one-fourth of the period T, or 90 degrees of phase, of the reference signal 37.

The timebase 30 includes a first sampler S1 that receives the reference signal 37 and a second sampler S2 that receives the shifted reference signal 39. A third sampler S3 included in the timebase 30 receives the divided reference signal 35. The samplers S1–S3 are typically diode-based switches, mixers, modulators, gating circuits, or other devices, suitable for acquiring samples of signals that are applied to the samplers in response to strobes.

A first strobe STROBE 1, activated by the synchronous trigger 31, is applied to the first sampler S1, the second sampler S2, and the third sampler S3. Typically, the first strobe STROBE 1 is generated via a step recovery diode (SRD) or other device or element that produces a pulse edge that is sufficiently sharp to provide a fast enough amplitude transition to drive the samplers S1–S3 in response to the activation by the synchronous trigger 31. The first strobe STROBE 1 causes the first sampler S1 to acquire sample X1 of the reference signal 37, the second sampler S2 to acquire sample X2 of the shifted reference signal 39, and the third sampler S3 to acquire sample X3 of the divided reference signal 35. As a result, each of the samplers S1–S3 acquires the respective samples X1–X3 according to a trigger event of the synchronous trigger 31, such as a rising edge, falling edge, or other designated event, position, characteristic or transition of the synchronous trigger 31. The trigger event of the synchronous trigger 31 shown in the timing diagram of FIG. 4 is a rising edge. The sample X1 is either a single sample, or a series of samples that are acquired by the sampler S1 and averaged, weighted, or otherwise processed to extract the sample X1. The sample X2 is either a single sample, or a series of samples that are acquired by the sampler S2 and averaged, weighted, or otherwise processed to extract the sample X2. The sample X3 is either a single sample, or a series of samples that are acquired by the sampler S3 and averaged, weighted, or otherwise processed to extract the sample X3.

The sample X1 of the reference signal 37 acquired by the first sampler S1, the sample X2 of the shifted reference signal 39 acquired by the second sampler S2, and the sample X3 of the divided reference signal 35 acquired by the third sample S3, are presented to a timing analyzer 38. The timing analyzer 38, typically including a digitizer 40 and a processor 42, converts the sample X1 into a first amplitude value A1 of the reference signal 37, converts the sample X2 to a second amplitude value A2, and converts the sample X3 to an amplitude value A3 of the divided reference signal 35.

Typically, the digitizer 40 includes at least one analog-to-digital converter (not shown) to transform the samples X1–X3 into corresponding amplitude values A1–A3. An intermediate frequency, or IF, converter (not shown) optionally included in the digitizer 40 enables low noise, low speed analog-to-digital converters to be used to transform the acquired samples into amplitude values. However, many types of digitizers are known in the art and are suitable for use as the digitizer 40 in the timebase 30.

The first amplitude value A1 and the second amplitude value A2 correspond to two amplitude values on the reference signal 37 at time positions T1 and T1–$\tau_T$, respectively, which are offset from each other by the time interval $\tau_T$ as shown in FIG. 4. The processor 42 maps the first amplitude value A1 and the second amplitude value A2 to the corresponding time position T1 on the reference signal 37 using interpolation, look-up tables, mathematical relationships or other suitable techniques for extracting a unique time position within the period T of the reference signal 37 based on the first amplitude value A1 and the second amplitude value A2. For example, when the reference signal 37 is defined according to a mathematical function, the first time position T1 is optionally extracted from two amplitude values from an inverse of the mathematical function, or a suitable variant of the inverse of the mathematical function. Alternatively, the amplitude values A1, A2 are both mapped to a unique time in a look-up table, so that from the two amplitude values the time position T1 can be extracted. In the example where the reference signal 37 is sinusoidal and the time interval $\tau_T$ is one-fourth of the period T of the reference signal 37, the processor 42 maps the amplitude values A1, A2 to the time position T1 according to the relationship T1=(T/360)* a1, where a1=arctan (A2/A1)+90 when A1$\geq$0, and where a1=arctan (A2/A1)+270 when A1<0.

A second strobe STROBE 2, activated by the divided reference signal 35 is applied to the signal sampler S. Typically, the second strobe STROBE 2 is generated via a step recovery diode (SRD) or other device or element that produces a pulse edge that is sufficiently sharp to provide a fast enough amplitude transition to drive the signal sampler S in response to the activation by the divided reference signal 35. FIG. 3B shows the timebase 30 with an optionally included gating circuit G that holds off acquisition of the samples X by the sampler S until after the occurrence of a trigger event of the synchronous trigger 31 that causes acquisitions of the samples X1–X3 by the samplers S1–S3.

The processor 42 maps the amplitude value A3 to a corresponding second time position T2 on the divided reference signal 35 using interpolation, look-up tables, mathematical relationships, or other suitable techniques for extracting a unique time position within the period D*T of the divided reference signal 35 from the amplitude value A3. When the divided reference signal 35 has the characteristic that amplitude values within a period D*T of the divided reference signal 35 have two corresponding time positions, the mapping of the amplitude value A3 to the time position T2 includes first coordinating the amplitude value A3 with two alternative positions t1, t2 on the divided reference signal 35 that have the amplitude value A3, and then selecting the time position T2 from the two alternative positions t1, t2, based on the period T of the reference signal 37 and the time position T1 on the reference signal 37. As an example, when the divided reference signal 35 is sinusoidal, the processor 42 first coordinates the amplitude value A3 to the alternative time positions t1, t2 on the divided reference signal 35 according to the relationships: t1=(D*T/360)arcsin(A3) when A3≧0, t1=D*T/360(360+ arcsin(A3)) when A3<0, and t2=(D*T/360)(180−arcsin (A3)). The time position T2 is selected to be t1 if T1=t1 mod T, where the equality accounts for the accuracy and resolution with which T1, T and t1 are determined, and where mod is the remainder that results from the division of t1 by the period T. Otherwise, the time position T2 is selected to be the position t2.

In an alternative mapping of the amplitude value A3 to the time position T2 on the divided reference signal 35, the processor 42 first designates an acquisition window within which the divided reference signal 35 has distinct, or unique, amplitude values for corresponding distinct, or unique, time positions. This results in there being a one-to-one correspondence between amplitude values and time positions on the divided reference signal 35 within the acquisition window. Then, using the one-to-one correspondence between amplitude values and time positions the processor 42 maps the amplitude value A3 to the time position T2. In one example, where the divided reference signal 35 is sinusoidal, there is such a one-to-one correspondence between amplitude values and time positions on the divided reference signal 35 when the acquisition window is the one half of the period D*T of the divided reference signal 35 that extends between a peak minimum and peak maximum amplitude value, or peak maximum and peak minimum amplitude value, of the divided reference signal 35.

Once the time position T1 on the reference signal 37 and the time position T2 on the divided reference signal 35 are established, the timing P of the samples X acquired by the sampler S relative to the synchronous trigger 31 is designated as D*T−(T*INT (T2/T)+T1), where INT (T2/T) represents the greatest integer number of periods T of the reference signal 37 that are encompassed within the time position T2.

With the reference signal 37 being asynchronous, and not having an established periodic relationship, with either the synchronous trigger 31 or the input signal 33, the divided reference signal 35, therefore, is also independent of both the synchronous trigger 31 and the input signal 33. As a result of the independence of the divided reference signal 35 that activates the signal sampler S from the input signal 33, successive acquisitions of the samples X of the input signal 33 occur at varied time positions on the input signal 33, enabling pseudo-random equivalent-time sampling or other successive sampling of the input signal 33 by the sampler S. This enables portions of the input signal 33 that occur within a period D*T of the divided reference signal 35 to be reconstructed or analyzed using the timebase 30, even when those portions of the input signal 33 do not lie within a single period T of the reference 37. Thus, as the samples X are successively acquired by the sampler S, the samplers S1–S3 in conjunction with the timing analyzer 38 accurately determine the timing P of the acquisitions of the samples X relative to the synchronous trigger 31 based on the time position T1 on the reference signal 37 and the time position T2 on the divided reference signal 35 at each of the successive acquisitions of the samples X. The timebase 30 enables the samples X to be acquired by the signal sampler S within the period D*T of the divided reference signal 35 that can be varied by adjusting the divisor D or the period T of the reference signal 37.

Because the timing P of the samples X of the signal sampler S relative to the synchronous trigger 31 is derived from the reference signal 37, the shifted reference signal 39 and the divided reference signal 35, the timing accuracy and jitter of the timebase 30 is attributable primarily to noise or other instabilities of the reference source 34, the divider 32, the reference delay 36 and the samplers. Phase-locked loop (PLL) techniques, filtering, and other noise reduction techniques enable, noise and instabilities of the reference source 34, divider 32 and samplers to be suppressed or minimized. Jitter, timing instabilities, or other noise imposed on the shifted reference signal 39 by the reference delay 36 is minimized by implementing the reference delay 36 passively, for example, using a hybrid quadrature coupler, or a transmission line, or by implementing the reference delay 36 using any other low-noise element or device capable of shifting, or time-delaying, the reference signal 37 by the predesignated time interval $\tau_T$.

The reference signal 37 and the divided reference signal 35 shown in FIG. 4 are sinusoidal, where the term sinusoidal includes pure sinusoidal waveforms, distorted sinusoidal waveforms and variations of sinusoidal waveforms. However, sawtooths, linear ramps, nonlinear ramps, or other types of periodic or semi-periodic signals having amplitudes capable of being mapped to a unique time position T1 within the period T of the reference signal 37, and to a unique time position T2 within the period D*T of the divided reference signal 35 are alternatively used.

The time interval $\tau_T$, by which the shifted reference signal 39 is shifted relative to the reference signal 37, is designated so that the amplitude values A1, A2 are sufficiently separated in time to determine the time position T1 on the reference signal 37 with sufficient timing accuracy. In the example where the reference signal 37 is sinusoidal, choosing the time interval $\tau_T$ to be one-fourth the predetermined period T of the reference signal 37 provides that when the sample X1 of the reference signal 37 and the sample X2 of the shifted reference signal 39 are simultaneously acquired, under condition that one of the samples is on a low amplitude-slope portion of the reference signal 37, such as a maximum peak or minimum peak, the other of the samples will be on a maximum slope portion of the reference signal 37. This provides that at least one of the amplitude values A1–A2 is accurately established, even in the presence of noise contributed by the samplers S1–S2, or noise contributed by the digitizer 40 when transforming the samples X1–X2 to corresponding amplitude values A1, A2. The amplitude value A3 and the corresponding time position T2 on the divided reference signal 35 mapped from the amplitude value A3 are established with sufficient accuracy to determine the greatest integer number of periods T of the reference signal 37 that are encompassed within the time position T2.

The processor 42 of the timebase 30 includes a microprocessor, computer, digital signal processor, controller, or other device, element or system, either internal or external to the timebase, that has access to the amplitude values A1–A3 and has capacity to manipulate the amplitude values, perform calculations, and establish correspondence between the amplitude values and contents of a look-up table, memory or other storage element or device in order to extract the time position T1 on the reference signal 37 from the amplitude values A1–A2, and the time position T2 on the divided reference signal 35 from the amplitude value A3. As an example, a model 86100B DIGITAL COMMUNICATIONS ANALYZER, available from AGILENT TECHNOLOGIES, INC., Palo Alto, Calif. includes an internal processor that is suitable for the processor 42 of the timebase 30.

The timebase 30 is implemented using a variety of technologies, such as analog hardware, digital hardware, software, or combinations of hardware and software. For example, digitizing one or more of the input signal 33, the reference signal 37, and the synchronous trigger 31 enables one or more of the divider 32, the reference delay 36, the timing analyzer 38, and the samplers S1–S3 to be implemented using hardware or software. Accordingly, the timebase 30 is well-suited for implementation as a method for determining the timing P of the samples X of the input signal 33 relative to the synchronous trigger 31.

Figure 5A:
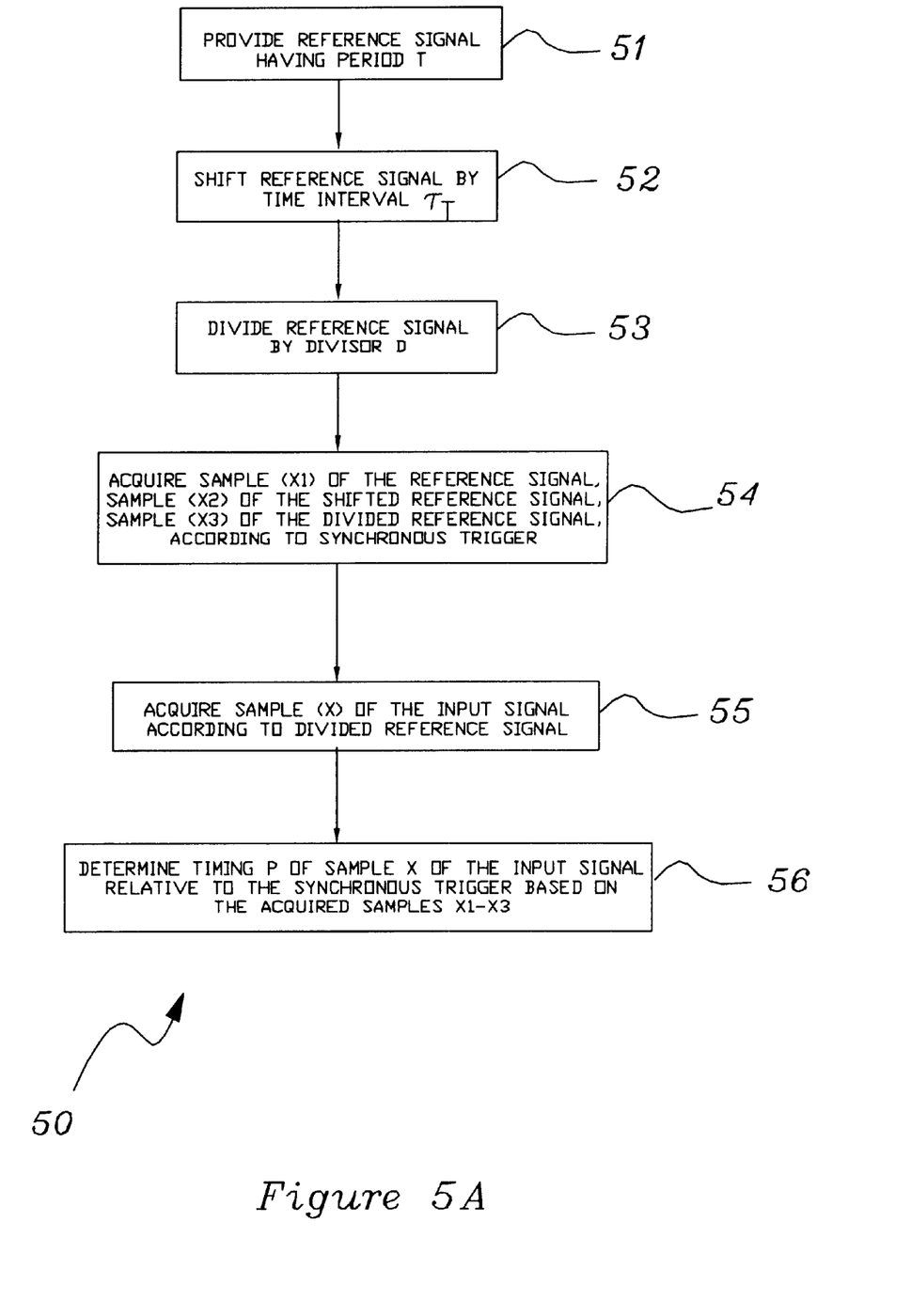
FIGS. 5A–5B are flow diagrams of a method for determining the timing of samples acquired from an input signal having a synchronous trigger, constructed according to an alternative embodiment of the present invention.

FIG. 5A shows a method 50 constructed according to an alternative embodiment of the present invention. In step 51 of the method 50, the reference signal 37 having the predetermined period T is provided. In step 52, the reference signal 37 is shifted by the predesignated time interval $\tau_T$. The reference signal 37 is divided by the divisor D in step 53. A set of samples X1, X2, and X3 of the reference signal 37, of the shifted reference signal 39, and of the divided reference signal 35, respectively, are acquired according to the synchronous trigger 31 in step 54. The samples X of the input signal 33 is acquired according the divided reference signal 35 in step 55. In step 56, the timing P of the acquired samples X of the input signal 33 is determined relative to the synchronous trigger 31, based on the samples X1–X3.

Figure 5B:
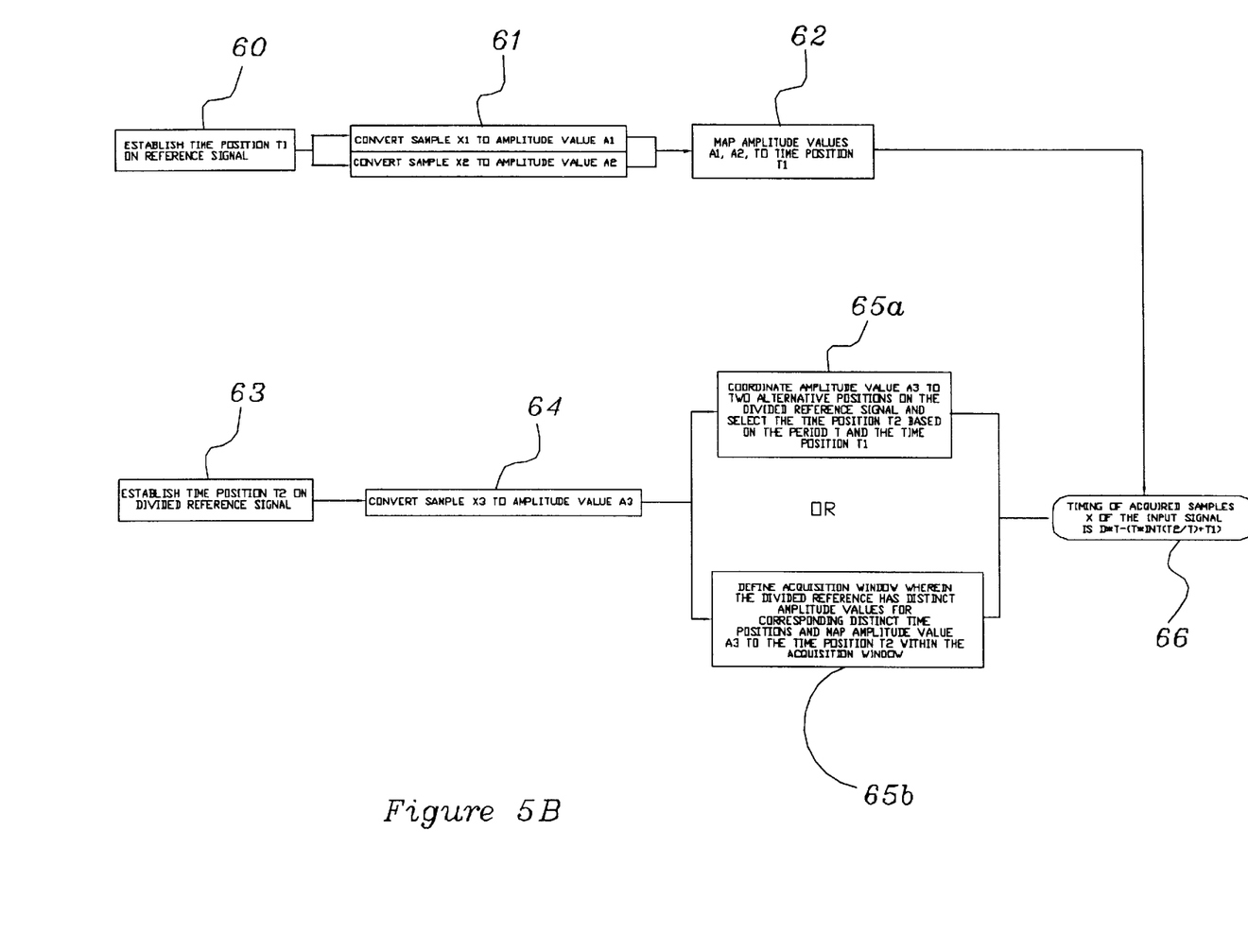

FIG. 5B shows a detailed view of step 56. In step 60, the time position T1 on the reference signal 37 is established. In step 63, the time position T2 on the divided reference signal 35 is established. Once the time position T1 and the time position T2 are established according to steps 60 and 63, the timing of the samples X acquired by the sampler S is designated in step 66 as $D*T-(T*INT(T2/T)+T1)$, where INT (T2/T) represents the greatest integer number of periods T of the reference signal 37 that are encompassed within the time position T2.

Typically, step 60 includes converting the sample X1 to the amplitude value A1 and converting the sample X2 to the amplitude value A2, as shown in step 61, and mapping the amplitude values A1, A2 to the time position T1 on the reference signal 37 as shown in step 62. However, the time position T1 on the reference signal 37 is alternatively established using phase detection, electronic counters, or other circuits, devices or systems used to establish time positions or phase positions on a periodic signal.

Step 63 typically includes first converting the samples X3 to the amplitude value A3 as shown in step 64, and then coordinating the amplitude value A3 to the two alternative time positions t1, t2 on the divided reference signal 35 having the amplitude value A3, and then selecting the time position T2 from one of the two alternative positions t1, t2 based on the period T of the reference signal 37 and the time position T1 on the reference signal 37, as shown in step 65a. However, the time position T2 on the divided reference signal 35 is alternatively established using phase detection, electronic counters, or other circuits, devices or systems used to establish time positions or phase positions on a periodic signal.

The mapping of the amplitude value A3 to the time position T2 in step 65a is alternatively implemented according to step 65b. Step 65b includes designating the acquisition window within which the divided reference signal 35 has distinct, or unique, amplitude values for corresponding distinct, or unique, time positions, and then using this one-to-one correspondence between amplitude values and time positions to map the amplitude value A3 to the time position T2.

The time positions T1, T2 are shown in FIG. 4 as each being established relative to zero-crossings of the reference signal 37 and divided reference signal 35. Alternatively, the time positions T1, T2 are established relative to any other designated position, event, or transition on the reference signal 37 and divided reference signal 35.

While the embodiments of the present invention have been illustrated in detail, it should be apparent that modifications and adaptations to these embodiments may occur to one skilled in the art without departing from the scope of the present invention as set forth in the following claims.

What is claimed is:

1. A timebase for a signal sampler receiving an input signal having a synchronous trigger, comprising:

a reference source providing a reference signal having a predetermined period, coupled to a reference delay that shifts the reference signal by a predesignated time interval;

a first sampler receiving the reference signal;

a second sampler receiving the shifted reference signal;

a divider receiving the reference signal and dividing the reference signal by a predesignated divisor;

a third sampler receiving the divided reference signal;

a first strobe activated by the divided reference signal causing sample acquisitions of the input signal by the signal sampler;

a second strobe activated by the synchronous trigger causing sample acquisitions of the reference signal by the first sampler, sample acquisitions of the shifted reference signal by the second sampler, and sample acquisitions of the divided reference signal by the third sampler; and a timing analyzer determining the timing of the sample acquisitions by the signal sampler relative to the synchronous trigger based on the sample acquisitions of the first sampler, the second sampler, and the third sampler.

2. The timebase of claim 1 wherein the timing analyzer, establishes a time position on the reference signal based on the sample acquisitions by the first sampler and by the second sampler, establishes a time position on the divided reference signal based on the sample acquisitions by the third sampler, and designates the timing of the sample acquisitions by the signal sampler to be a difference between a product of the predesignated divisor and the predetermined period, and a sum of, the predetermined period times a greatest integer number of periods of the reference signal that are encompassed within the time position on the divided reference signal and the established time position on the reference signal.

3. The timebase of claim 2 wherein the timing analyzer includes a digitizer converting the sample acquisitions by the first sampler into a first amplitude value of the reference signal, converting the sample acquisitions by the second sampler into a second amplitude value of the reference signal, and converting the sample acquisitions by the third sampler into a third amplitude value of the divided reference signal.

4. The timebase of claim 3 wherein the timing analyzer maps the first amplitude value and the second amplitude value to the time position on the reference signal and maps the third amplitude value to the time position on the divided reference signal.

5. The timebase of claim 4 wherein the divisor is an even integer, and the timing analyzer coordinates the third amplitude value to two alternative positions on the divided reference signal having the third amplitude value and selects the time position on the divided reference from one of the two alternative positions based on the predetermined period and the time position on the reference signal.

6. The timebase of claim 4 wherein the timing analyzer defines an acquisition window within which the divided reference signal has a series of distinct amplitudes that correspond to a series of distinct time positions, and the third amplitude value is mapped to the time position on the divided reference signal based on the correspondence between the series of distinct amplitudes and the series of distinct time positions.

7. The timebase of claim 1 wherein the timing analyzer includes a digitizer converting the sample acquisitions by the first sampler into a first amplitude value of the reference signal, converting the sample acquisitions by the second sampler into a second amplitude value of the reference signal, and converting the sample acquisitions by the third sampler into a third amplitude value of the divided reference signal.

8. The timebase of claim 7 wherein at least one of the reference signal and the divided reference signal is sinusoidal.

9. The timebase of claim 7 wherein the timing analyzer maps the first amplitude value and the second amplitude value to the time position on the reference signal and maps the third amplitude value to the time position on the divided reference signal.

10. The timebase of claim 9 wherein the divisor is an even integer, and the timing analyzer coordinates the third amplitude value to two alternative positions on the divided reference signal having the third amplitude value and selects the time position on the divided reference from one of the two alternative positions based on the predetermined period and the time position on the reference signal.

11. The timebase of claim 9 wherein the timing analyzer defines an acquisition window within which the divided reference signal has a series of distinct amplitudes that correspond to a series of distinct time positions, and the third amplitude value is mapped to the time position on the divided reference signal based on the correspondence between the series of distinct amplitudes and the series of distinct time positions.

12. The timebase of claim 9 wherein at least one of the reference signal and the divided reference signal is sinusoidal.

13. The timebase of claim 1 wherein at least one of the reference signal and the divided reference signal is sinusoidal.

14. A method for establishing timing of samples acquired from an input signal having a synchronous trigger, comprising:
  providing a reference signal having a predetermined period;
  dividing the reference signal by a predesignated divisor;
  shifting the reference signal by a predesignated time interval;
  acquiring a sample of each of the reference signal, the divided reference signal, and the shifted reference signal, according to the synchronous trigger;
  acquiring a sample of the input signal according to the divided reference signal; and
  determining the timing of the acquired sample of the input signal relative to the synchronous trigger based on the acquired samples of the reference signal, the divided reference signal and the shifted reference signal.

15. The method of claim 14 wherein determining the timing of the acquired samples of the applied signal includes establishing a time position on the reference signal, establishing a time position on the divided reference signal, and designating the timing of the acquired samples of the applied signal to be a difference between a product of the predesignated divisor and the predetermined period, and a sum of, the predetermined period times a greatest integer number of periods of the reference signal that are encompassed within the time position on the divided reference signal and the established time position on the reference signal.

16. The method of claim 15 wherein establishing the time position on the reference signal includes converting the samples of the reference signal and of the shifted reference signal to a first amplitude value and a second amplitude value, and wherein establishing the time position on the divided reference signal includes converting the acquired sample of the divided reference signal to a third amplitude value.

17. The method of claim 16 wherein at least one of the reference signal and the divided reference signal is sinusoidal.

18. The method of claim 17 wherein the first amplitude value and the second amplitude value are mapped to the time position on the reference signal, and wherein the third amplitude value is mapped to the time position on the divided reference signal.

19. The method of claim 18 wherein the divisor is an even integer, and wherein mapping the third amplitude to the time position on the divided reference signal includes coordinating the third amplitude value to two alternative positions on the divided reference signal that have the third amplitude value and selecting the time position on the divided reference signal from one of the two alternative positions based on the predetermined period and the time position on the reference signal.

20. The method of claim 18 wherein establishing the time position on the divided reference signal includes defining an acquisition window within which the divided reference signal has a series of distinct amplitudes that correspond to a series of distinct time positions, and the third amplitude value is mapped to the time position on the divided reference signal based on the correspondence between the series of distinct amplitudes and the series of distinct time positions.

21. The method of claim 16 wherein the first amplitude value and the second amplitude value are mapped to the time position on the reference signal, and wherein the third amplitude value is mapped to the time position on the divided reference signal.

22. The method of claim 21 wherein the divisor is an even integer, and wherein mapping the third amplitude value to the time position on the divided reference signal includes coordinating the third amplitude value to two alternative positions on the divided reference signal that have the third amplitude value and selecting the time position on the divided reference signal from one of the two alternative positions based on the predetermined period and the time position on the reference signal.

23. The method of claim 21 wherein establishing the time position on the divided reference signal includes defining an acquisition window within which the divided reference signal has a series of distinct amplitudes that correspond to a series of distinct time positions, and the third amplitude value is mapped to the time position on the divided reference signal based on the correspondence between the series of distinct amplitudes and the series of distinct time positions.

24. A method for establishing timing of samples acquired from an input signal having a synchronous trigger, comprising:

providing a reference signal asynchronous with the input signal, and having a predetermined period;

dividing the reference signal by a predesignated divisor;

acquiring samples of the input signal according to the divided reference signal;

establishing a time position on the reference signal and a time position on the divided reference signal;

determining the timing of the samples of the input signal relative to the synchronous trigger based on the time position on the reference signal and the time position on the divided reference signal.

25. The method of claim 24 wherein establishing the time position on the reference signal includes acquiring a sample of the reference signal and a sample of the reference signal that is shifted by a predesignated time interval, according to the synchronous trigger, and wherein establishing the time position on the divided reference signal includes acquiring a sample of the divided reference signal.

26. The method of claim 25 wherein at least one of the reference signal and the divided reference signal is sinusoidal, and wherein the predesignated time interval is one-fourth of the predetermined period of the reference signal.

27. The method of claim 24 wherein the timing of the samples of the input signal relative to the synchronous trigger is a difference between a product of the predesignated divisor and the predetermined period, and a sum of, the predetermined period times a greatest integer number of periods of the reference signal that are encompassed within the time position on the divided reference signal and the established time position on the reference signal.

28. The method of claim 27 wherein at least one of the reference signal and the divided reference signal is sinusoidal, and wherein the predesignated time interval is one-fourth of the predetermined period of the reference signal.

29. The method of claim 24 wherein at least one of the reference signal and the divided reference signal is sinusoidal.

30. The method of claim 24 wherein at least one of the reference signal and the divided reference signal is sinusoidal, and wherein the predesignated time interval is one-fourth of the predetermined period of the reference signal.

* * * * *